United States Patent
Iwata et al.

(10) Patent No.: US 6,649,434 B2
(45) Date of Patent: Nov. 18, 2003

(54) METHOD OF MANUFACTURING SEMICONDUCTOR DEVICE HAVING ZNO BASED OXIDE SEMICONDUCTOR LAYER

(75) Inventors: Kakuya Iwata, Tsukuba (JP); Paul Fons, Tsukuba (JP); Koji Matsubara, Tsukuba (JP); Akimasa Yamada, Ibaraki (JP); Shigeru Niki, Tsukuba (JP); Ken Nakahara, Kyoto (JP)

(73) Assignees: National Institute of Advanced Industrial Science and Technology, Tokyo (JP); Rohm Co. Ltd., Kyoto (JP)

( * ) Notice: Subject to any disclaimer, the term of this patent is extended or adjusted under 35 U.S.C. 154(b) by 0 days.

(21) Appl. No.: 09/950,831

(22) Filed: Sep. 13, 2001

(65) Prior Publication Data

US 2002/0058351 A1 May 16, 2002

(30) Foreign Application Priority Data

Sep. 13, 2000 (JP) ........................ 2000-278043

(51) Int. Cl.$^7$ ............................................. H01L 21/20
(52) U.S. Cl. .................. 438/22; 438/758; 438/492; 438/481
(58) Field of Search ..................... 438/22, 24, 46, 438/47, 478, 483, 85, 758, 492, 493, 481; 257/103

(56) References Cited

U.S. PATENT DOCUMENTS

| | | | |
|---|---|---|---|
| 5,578,501 A | * 11/1996 | Niwa | |
| 6,057,561 A | * 5/2000 | Kawasaki et al. | 257/94 |
| 6,261,859 B1 | * 7/2001 | Ouchi | 438/39 |
| 6,358,378 B2 | * 3/2002 | Choi et al. | 204/192.15 |
| 6,407,405 B1 | * 6/2002 | Sano et al. | 257/15 |
| 6,423,983 B1 | * 7/2002 | Narayan et al. | 257/96 |
| 6,448,585 B1 | * 9/2002 | Kadota | 257/103 |
| 2002/0014631 A1 | * 2/2002 | Iwata et al. | 257/89 |
| 2002/0025594 A1 | * 2/2002 | Iwata et al. | 438/46 |
| 2002/0044028 A1 | * 4/2002 | Lu et al. | 333/152 |

* cited by examiner

Primary Examiner—Savitri Mulpuri
(74) Attorney, Agent, or Firm—Arent Fox Kintner Plotkin & Kahn, PLLC

(57) ABSTRACT

In the case in which a ZnO based oxide semiconductor layer is to be hetero-epitaxially grown on a substrate formed of a material which is different from that of a ZnO based oxide semiconductor, the ZnO based oxide semiconductor layer is grown at a high temperature of 500° C. or more, and supply of oxygen is stopped and gradual cooling is carried out until a substrate temperature is lowered to 350° C. or less after the growth of the ZnO based oxide semiconductor layer is completed. As a result, it is possible to suppress the generation of dislocations or crystal defects over an epitaxial grown layer based on the atmosphere while the substrate temperature is lowered after the growth of the semiconductor layer and a difference in a coefficient of thermal expansion, thereby obtaining a semiconductor device having a high quality ZnO based oxide semiconductor layer which has an excellent crystalline property and a semiconductor light emitting device having the high characteristics.

5 Claims, 2 Drawing Sheets

METHOD OF MANUFACTURING SEMICONDUCTOR DEVICE HAVING ZNO BASED OXIDE SEMICONDUCTOR LAYER

FIELD OF THE INVENTION

The present invention relates to a method of manufacturing a semiconductor device in which a ZnO based oxide semiconductor layer is subjected to hetero epitaxial growth on a sapphire substrate, for example, in a light emitting device such as a light emitting diode (hereinafter referred to as an LED) using a ZnO based oxide semiconductor or a laser diode (hereinafter referred to as an LD), an SAW device such as an SAW (surface acoustic wave) filter or an SAW oscillating device, a pyroelectric device, a piezoelectric device, a gas sensor or the like. More specifically, the present invention relates to a method of manufacturing a semiconductor device having a high quality ZnO based oxide semiconductor layer which decreases dislocations or crystal defects being apt to generate in a grown film based on an atmosphere gas after growth, a stress caused by a difference in a coefficient of thermal expansion between a substrate and a ZnO based oxide semiconductor layer or the like.

BACKGROUND OF THE INVENTION

A blue color based (a wavelength region from ultraviolet to yellow) light emitting diode (hereinafter referred to as an LED) to be used for a full color display, a signal light or the like and a blue laser diode (hereinafter referred to as an LD) for a very fine DVD light source for a next generation which continuously oscillates at a room temperature can be obtained by laminating GaN based compound semiconductor layers on a sapphire substrate and have recently attracted the attention. While the GaN based compound semiconductor is in major in the light emitting device having a short wavelength, it has also been investigated that a II–VI compound semiconductor such as ZnO is used. The ZnO has a band gap of 3.37 eV at a room temperature and it has also been expected that the ZnO based oxide can be applied to a transparent conductive film, a transparent TFT, a transparent conductive film, an SAW device, a piezoelectric device and the like in addition to the DVD light source.

The ZnO based oxide semiconductor is also a hexagonal crystal in the same manner as a GaN based compound semiconductor or sapphire and has a lattice constant close to that of GaN. Therefore, there has been proposed, as a substrate, sapphire which has been widely used industrially as a substrate for epitaxial growth of a GaN based compound semiconductor. However, the lattice constant ("a" axial length) of the sapphire is 0.4758 nm, while the "a" axial length of ZnO is 0.3252 nm. There is a problem in that a mismatch is great based on a difference in the lattice constant and a dislocation or a crystal defect is easily generated in an epitaxial grown layer. For this reason, it has been proposed a method of forming a buffer layer such as a ZnO layer on the sapphire substrate at a low temperature of approximately 350° C. and then growing a ZnO based oxide semiconductor layer at a high temperature of approximately 600° C.

As described above, the sapphire substrate is regarded as the optimum material which is currently proposed for such a substrate as to grow a ZnO based oxide semiconductor layer. However, there is a problem in that the dislocation or the crystal defect in the epitaxial grown layer cannot fully be decreased even if the effort such as interposing a buffer layer or the like is made when the ZnO based oxide semiconductor layer grows on the surface of the sapphire substrate, and a high quality ZnO based oxide semiconductor layer which has an excellent crystalline property cannot be thereby obtained.

SUMMARY OF THE INVENTION

In order to solve such a problem, the present inventors vigorously made investigations repetitively. As a result, it was found the following. More specifically, a countermeasure has conventionally been taken based on such a thought that a crystal defect is caused by a lattice mismatching based on a difference in a lattice constant between a substrate and a ZnO based oxide layer to be epitaxially grown, which should be solved. However, sapphire and ZnO have coefficients of thermal expansion of $7.3 \times 10^{-6}$ $K^{-1}$ and $4.53 \times 10^{-6}$ $K^{-1}$ respectively and a dislocation or a crystal defect is newly generated based on the difference in the coefficient of thermal expansion. In general, furthermore, after a semiconductor layer of this kind is completely grown, a substrate temperature is lowered while causing a gas of a material including a constituent element having a high vapor pressure to flow. When the ZnO based oxide semiconductor layer is left in the oxygen atmosphere, the dislocation or the crystal defect easily proceeds.

In consideration of such a situation, an object of the present invention is to provide a method of manufacturing a semiconductor device having a high quality ZnO based oxide semiconductor layer having an excellent crystalline property in which a dislocation or a crystal defect can be prevented from being generated over an epitaxial grown layer based on the atmosphere while a substrate temperature is lowered after the growth of the semiconductor layer and a difference in a coefficient of thermal expansion.

As described above, the present inventors vigorously made investigations repeatedly in order to improve the crystalline property of the ZnO based oxide semiconductor layer to be epitaxially grown on a sapphire substrate. As a result, it was found the following. More specifically, when the ZnO based oxide semiconductor layer is epitaxially grown at a high temperature of approximately 600° C. and a heater for heating the substrate is turned off immediately after the growth, the temperature of the substrate is changed quickly and a stress is applied to both of the substrate and the ZnO based oxide semiconductor layer based on a difference in a coefficient of thermal expansion therebetween. Consequently, a dislocation or a crystal defect is newly generated in the epitaxially grown layer.

More specifically, even if the growth is carried out carefully such that the crystal defect is not generated during the epitaxial growth of the ZnO based oxide semiconductor layer, the dislocation or the crystal defect is newly generated when the substrate temperature is rapidly lowered after the growth is completed. Consequently, it was found that the characteristic of the device is greatly influenced by this new dislocation or crystal defect.

Furthermore, the following was found. After the growth of the ZnO based oxide semiconductor layer is completed, the supply of oxygen to be raw material of a ZnO based oxide is stopped and the lowering in the temperature is carried out at a low speed of 5 to 10° C./minute or less, for example. Consequently, a ZnO based oxide semiconductor layer having an excellent crystalline property can be obtained. Moreover, the following was found. Conventionally, the gas of a constituent element having a high vapor pressure has been caused to flow when the substrate temperature is lowered. In the case of the ZnO based oxide, when the substrate temperature is lowered in the oxygen gas atmosphere, the surface is roughened by the oxygen, which is not preferable. By stopping the supply of the oxygen, a ZnO based oxide semiconductor layer having an excellent crystalline property can be obtained.

As a matter of course, a ZnO based oxide can be epitaxially grown also at a low temperature of approximately 400° C. In the case in which the epitaxial growth is carried out at such a temperature, a new crystal defect is rarely generated because the difference from a room temperature is small even if a heater for heating a substrate is directly turned off to rapidly lower the temperature. But if the temperature of the epitaxial growth is low, a residual carrier concentration cannot be decreased. When the epitaxial growth is carried out at a high temperature of approximately 550 to 600° C., the residual carried concentration can be decreased so that a semiconductor layer having a desirable carrier concentration can be obtained and the carrier concentration of a p-type layer can also be increased. The present inventors found these facts in another foregoing investigations.

So, it is preferable that the ZnO based oxide semiconductor layer should be epitaxially grown at a high temperature of approximately 500° C. or more, and that a lowering the substrate temperature after the growth should be particularly controlled carefully.

A method of manufacturing a semiconductor device having a ZnO based oxide semiconductor layer according to the present invention comprises the steps of; growing hetero-epitaxially the ZnO based oxide semiconductor layer on a substrate having a coefficient of thermal expansion which is different from that of a ZnO based oxide semiconductor, at a high temperature of 500° C. or more, and stopping the supply of an oxygen and cooling gradually until the temperature of the substrate is lowered to 350° C. or less after the growth of the ZnO based oxide semiconductor layer is completed.

The ZnO based oxide semiconductor means an oxide including Zn and includes an oxide of IIA group and Zn, IIB group and Zn or IIA group, IIB group and Zn in addition to ZnO as a specific example.

By using this method, it is possible to prevent new dislocations or crystal defects from being induced during lowering the substrate temperature in the ZnO based oxide semiconductor layer. Consequently, a carrier concentration in an undoped state can be reduced and a mobility can be improved. As a result, the crystalline property of an active layer in a semiconductor light emitting device becomes excellent and a high light emission efficiency can be obtained. In addition, although the carrier concentration of a p-type layer or the like could not be increased fully, the crystalline property can be improved so that the mobility of a carrier can be improved and the carrier concentration can also be increased greatly.

It is preferable that a buffer layer comprising a ZnO based oxide semiconductor layer should be grown at a lower temperature than the high temperature at which the ZnO based oxide semiconductor layer is to be grown on the substrate before the semiconductor layer is grown at the high temperature of 500° C. or more, and the irradiation (supply) of an oxygen should be then stopped when the substrate temperature is to be raised to grow the semiconductor layer at the high temperature.

DETAILED DESCRIPTION

Next, a method of manufacturing a semiconductor device having a ZnO based oxide semiconductor layer according to the present invention will be described with reference to the drawings. The method of manufacturing a semiconductor device according to the present invention is characterized in that when a ZnO based oxide semiconductor layer is to be hetero-epitaxially grown on a substrate having a coefficient of thermal expansion which is different from that of a ZnO based oxide semiconductor, the ZnO based oxide semiconductor layer is grown at a high temperature of 500° C. or more, and supply of oxygen is stopped and gradual cooling is carried out until the substrate temperature is lowered to 350° C. or less after the growth of the ZnO based oxide semiconductor layer is completed as shown in a flow chart according to an embodiment in FIG. 1.

Figure 1:
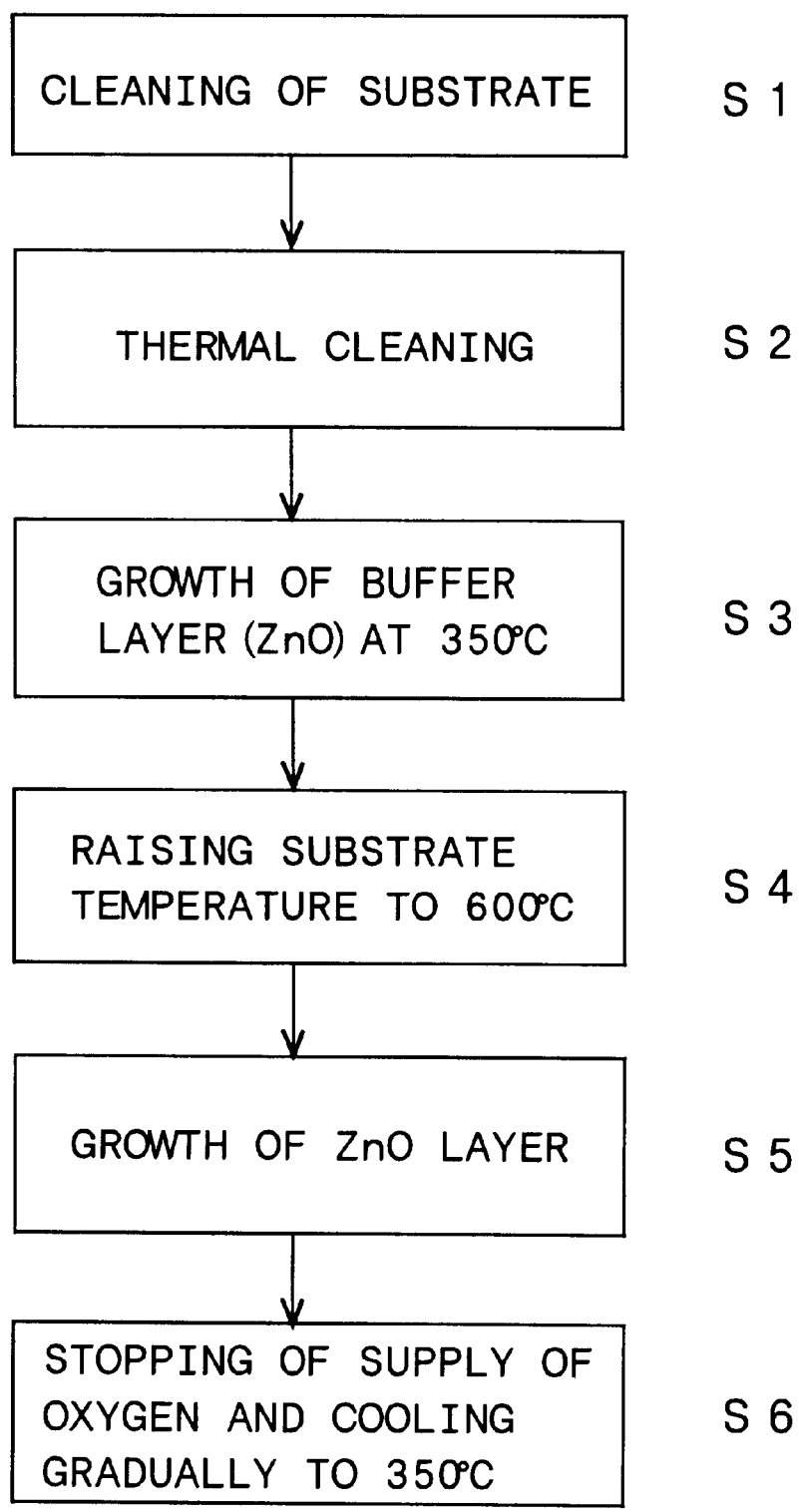
FIG. 1 is a flow chart showing an embodiment of a method of manufacturing a semiconductor device according to the present invention.

More specifically, as shown in FIG. 1, a sapphire substrate is degreased and cleaned (S1) and is then put in an MBE (Molecular Beam Epitaxy) growing chamber, for example, and the temperature of the substrate is raised to approximately 700° C., and thermal cleaning is carried out for approximately 20 minutes (S2). After that, the substrate temperature is lowered to approximately 350° C. to open the cells of Zn and an oxygen radical. Consequently, a buffer layer made of ZnO is grown in a thickness of approximately 0.1 m (S3). After that, the Zn cell is closed and the irradiation (supply) of the oxygen radical is stopped to raise the substrate temperature to approximately 600° C. (S4). The rise in the temperature is carried out by increasing the current of a normal heater and the temperature is raised at a rate of approximately 50 to 100° C./minute.

When the substrate temperature reaches a predetermined temperature, for example, approximately 600° C., the cells of Zn and the oxygen radical are opened again to grow an undoped ZnO layer in a thickness of approximately 1 to 2 μm, for example (S5). Then, the supply of the oxygen radical is stopped, and the heater for heating a substrate is not turned off at once but the current is gradually reduced. Consequently, the substrate temperature is lowered to 350° C. or less at a rate of approximately 5 to 10° C./minute, for example (S6). After that, if the substrate is taken out of the growing chamber, an undoped ZnO layer can be obtained on the surface of the sapphire substrate.

As described above, the present inventors variously changed conditions, for example, the lowering speed of the substrate temperature after the growth of the ZnO based oxide semiconductor layer, the presence or absence of oxygen radical O* (active oxygen) irradiation at the lowering time and the like in the process shown in FIG. 1 to investigate a mobility ($cm^2V^{-1}s^{-1}$) and a carrier concentration ($cm^{-3}$) at that time in order to enhance the crystalline property of the ZnO based oxide semiconductor layer grown on the sapphire substrate. The result is shown in Table 1.

TABLE 1

Change in carrier concentration and mobility based on temperature lowering speed and presence or absence of oxygen irradiation

| temperature lowering speed | Low | low | high | high |
| --- | --- | --- | --- | --- |

TABLE 1-continued

Change in carrier concentration and
mobility based on temperature lowering speed
and presence or absence of oxygen irradiation

| presence or absence of O* | Presence | absence | presence | absence |
|---|---|---|---|---|
| carrier concentration ($cm^{-3}$) | $6.18 \times 10^{16}$ | $1.16 \times 10^{17}$ | $1.24 \times 10^{18}$ | $1.59 \times 10^{18}$ |
| mobility ($cm^2V^{-1}s^{-1}$) | 8.77 | 82.3 | 29 | 65.8 |

In the Table 1, a low temperature lowering speed corresponds to 7° C./minute, that is, the gradual cooling in the present invention and a high temperature lowering speed implies the temperature is lowered at a speed of approximately 200° C./minute, for example, in a method of turning off a conventional heater at a time. Moreover, the presence or absence of the oxygen radical O* conventionally sets, to "presence", a state in which a gas such as oxygen is continuously irradiated to raise or lower the temperature also after the growth of the semiconductor layer is completed and sets, to "absence", a state in which the irradiation of the oxygen radical is also stopped. As is apparent from the Table 1, the irradiation of the radical oxygen is stopped to lower the temperature slowly (5 to 10° C./minute). Consequently, a great mobility of 82.3 was obtained with a low carrier concentration.

As is apparent from the Table 1, even if the temperature is lowered slowly and the irradiation of the oxygen radical is continuously carried out, the mobility is more reduced than the rapid cooling, which is not preferable. This indicates that the effect based on take-in of the oxygen (to take in O between lattices) is greater than the generation of dislocations or crystal defects based on a difference in a coefficient of thermal expansion.

In the above example, the temperature is lowered at the rate of 7° C./min. If the speed is too reduced, the time is excessively taken so that mass production cannot be carried out. As the temperature lowering speed is increased, the carrier concentration of undoping is increased so that the mobility is reduced to approach the conventional cooling method. For this reason, it is desirable that the gradual cooling should be carried out at a rate of approximately 5 to 50° C./minute, more preferably, approximately 5 to 10° C./minute. Moreover, the same results were obtained with a ZnO based oxide mixing a Mg or Cd element. Also in the growth using the MOCVD (Metal Organic Chemical Vapor Deposition) method in place of the MBE method, the same results were obtained.

According to the present invention, after the growth of the ZnO based oxide semiconductor layer is wholly completed, the substrate temperature is lowered very slowly from a high temperature of approximately 600° C. to be a growing temperature to a low temperature close to a room temperature (a temperature lowering time of approximately five minutes has conventionally be taken from the end of the epitaxial growth to the vicinity of the room temperature, while a time of approximately 45 minutes is taken in the present invention). Therefore, even if the coefficients of thermal expansion of the substrate and the ZnO based oxide semiconductor layer are different from each other, a stress thereof is not greatly applied to the ZnO based oxide semiconductor layer.

In addition, conventionally, even if the growth of the ZnO based oxide semiconductor layer is completed, the cell of a metal material such as Zn or Mg is generally closed to block irradiation and the material source of a gas such as oxygen is continuously caused to flow. By blocking at least the irradiation of an oxygen radical, the oxygen is not excessively taken between lattices or the like. Even if a long time is taken to lower the temperature, a stress based on a difference in the coefficient of thermal expansion is simply eliminated so that a very excellent ZnO based oxide semiconductor layer can be obtained.

Figure 2:
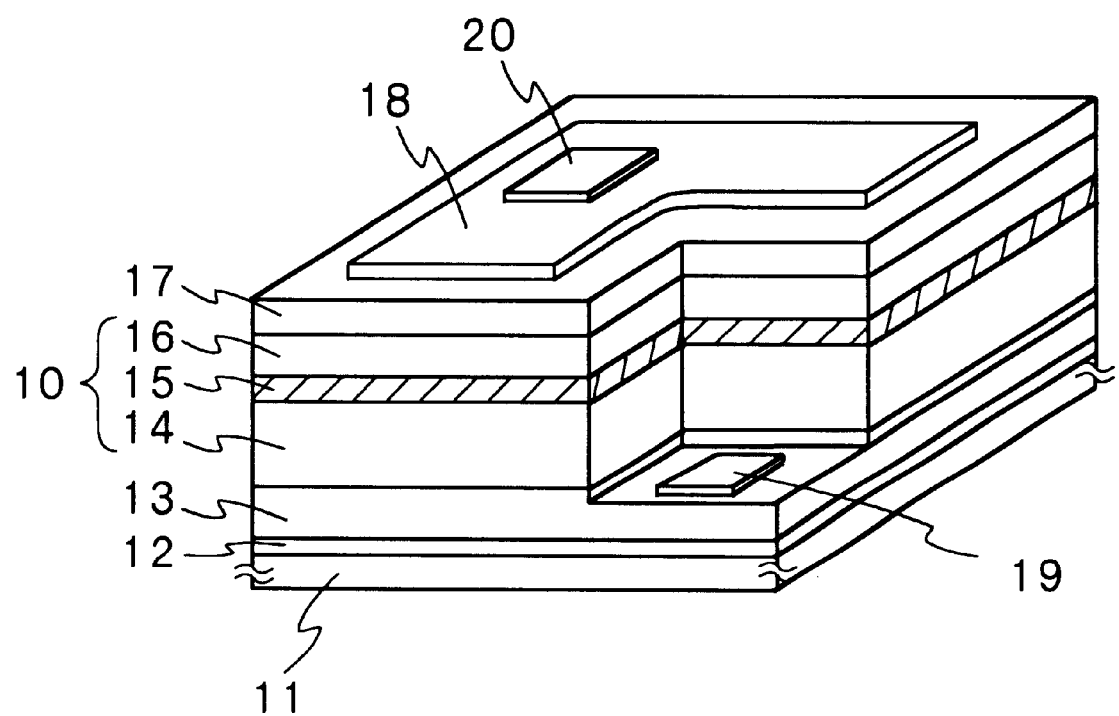
FIG. 2 is a view illustrating an LED chip according to an example of a device to be manufactured according to the present invention.

Furthermore, a method of manufacturing an LED chip shown in FIG. 2 will be described as a specific example. In the LED, a light emitting layer forming portion 10 has such a structure that an active layer 15 made of $Cd_xZn_{1-x}O$ ($0 \leq x<1$, for example, x=0.08) and having a thickness of approximately 0.1 μm is sandwiched between an n-type cladding layer 14 made of $Mg_yZn_{1-y}O$ ($0 \leq y<1$, for example, y=0.15) and having a thickness of approximately 2 μm and a p-type cladding layer 16 made of $Mg_yZn_{1-y}O$ ($0 \leq y<1$, for example, y=0.15) and having a thickness of approximately 2 μm. A p-type contact layer 17 made of p-type ZnO is provided in a thickness of approximately 1 μm on a surface of the p-type cladding layer 16.

In order to manufacture the LED, a sapphire substrate 11 is set into an MBE growing chamber, for example, and a substrate temperature is set to 600 to 700° C. and thermal cleaning is carried out. Then, the substrate temperature is set to approximately 400° C. and the shutters of an oxygen radical source (cell) and a Zn source (cell) are opened for irradiation. Consequently, a buffer layer 12 made of ZnO is formed in a thickness of approximately 50 nm to 0.1 μm.

Subsequently, the irradiation of the oxygen is stopped to set the substrate temperature to approximately 550 to 600° C. and the shutter of the oxygen radical is then opened again to irradiate the oxygen radical and Zn, and the shutter of Al or Ga to be an n-type dopant is also opened so that an n-type contact layer 13 made of n-type ZnO is grown in a thickness of approximately 1.5 μm. Then, the shutter of Mg is also opened to grow the n-type cladding layer 14 made of $Mg_yZn_{1-y}O$ (0<y<1, for example, y=0.15) in a thickness of approximately 2 μm, and the supply of Mg is stopped and the shutter of Cd is opened to grow an undoped active layer 15 made of $Cd_xZn_{1-x}O$ (0<x<1, for example, x=0.08) in a thickness of approximately 0.1 μm.

Thereafter, the supply of Cd is stopped to open the shutter of Mg again, and furthermore, the shutter of plasma excitation nitrogen is opened to grow the p type cladding layer 16 made of p-type $Mg_yZn_{1-y}O$ doped with N (0<y<1, for example, y=0.15) in a thickness of approximately 2 μm. Furthermore, the supply of Mg is stopped to sequentially grow the p-type contact layer 17 made of p-type ZnO in a thickness of approximately 1 μm. The light emitting layer forming portion 10 is constituted by the n-type cladding layer 14, the active layer 15 and the p-type cladding layer 16.

Subsequently, the supply of all the materials including the oxygen radical is stopped to slowly lower the substrate temperature at a rate of 5 to 10° C. every minute. After the substrate temperature is fully lowered to the vicinity of a room temperature, a wafer grown epitaxially is taken out of the MBE growing chamber. Then, the wafer is put in a sputtering apparatus and an ITO film 18 to be a transparent conductive film is provided in a thickness of approximately 0.15 μm.

After that, a part of the laminated semiconductor layers is subjected to dry etching such as a RIE method, thereby exposing the n-type contact layer 13 and polishing the sapphire substrate 11 to set the thickness of the substrate 11 to be approximately 100 μm. A p-side electrode 20 formed of Ni/Al and an n-side electrode 19 formed of Ti/Au are provided on the ITO film 18 and the surface of the n-type contact layer 13 exposed by the etching through vacuum evaporation using a lift-off method, for example, respectively. Subsequently, a chip is cut away from the wafer so that an LED chip shown in FIG. 2 is obtained.

While the light emitting layer forming portion 10 is an LED chip having a double hetero junction in this example, another junction structure such as a pn junction structure of a hetero junction or a homo junction may be used. Moreover, the same effects can be obtained in an LD in place of the LED. In this case, for example, it is preferable that the active layer 15 should be formed with a multi-quantum well structure in which two to five respectively non-doped barrier layers and well layers formed of $Cd_{0.03}Zn_{0.97}O/Cd_{0.2}Zn_{0.8}O$ are alternately provided in thicknesses of 5 nm and 4 nm, respectively.

Moreover, in the case in which the active layer 15 is thin and light cannot be fully confined in the active layer 15, light guide layers formed of ZnO are provided on both sides of the active layer, for example. Furthermore, a transparent electrode formed of the ITO film 18 is not required and the p-side electrode 20 is directly formed by stripe-like patterning, the upper portion of the semiconductor layer is etched into a mesa shape or a current constricting layer is buried. Consequently, a structure for defining a current injection region is formed.

According to the method of manufacturing a semiconductor light emitting device in accordance with the present invention, the crystalline properties of the active layer constituting the light emitting layer forming portion and the n-type cladding layer, the p-type cladding layer and the like are very excellent. The crystalline property of the active layer is improved so that the light emission efficiency of the LED and the threshold current value of the LD can be improved. Moreover, the carrier concentration of the p-type cladding layer can be increased considerably (the mobility is great). Therefore, a series resistance can be reduced. Thus, it is possible to obtain a light emitting device having a high characteristic in which a great output can be obtained with a low operating voltage. Moreover, since a high quality ZnO based oxide semiconductor layer having an excellent crystalline property can be obtained, the quality of the semiconductor device having the ZnO based semiconductor layer other than the light emitting device can be enhanced.

According to the present invention, also in the case in which the ZnO based oxide semiconductor layer is to be grown on the sapphire substrate having a lattice constant and a coefficient of thermal expansion which are greatly different, it is possible to greatly suppress the generation of dislocations, crystal defects and the like, thereby carrying out the growth. As a result, it is possible to obtain a semiconductor device having a ZnO based oxide semiconductor layer with the high performance such as a semiconductor light emitting device through a ZnO based oxide semiconductor layer having an excellent crystalline property.

Although preferred examples have been described in some detail it is to be understood that certain changes can be made by those skilled in the art without departing from the spirit and scope of the invention as defined by the appended claims.

What is claimed is:

1. A method of manufacturing a semiconductor device having a ZnO based oxide semiconductor layer, comprising the steps of:

growing a buffer layer made of a ZnO based oxide semiconductor on a substrate having a coefficient of thermal expansion which is different from that of a ZnO based oxide semiconductor, at a lower temperature than a high temperature of 500° C. or more, before the growth of said ZnO based oxide semiconductor layer, stopping the supply of an oxygen and raising the temperature of said substrate to said high temperature to grow said ZnO based oxide semiconductor layer, growing hetero-epitaxially said ZnO based oxide semiconductor layer on a substrate having a coefficient of thermal expansion which is different from that of a ZnO based oxide semiconductor, at a said high temperature of 500° C. or more, and stopping the supply of an oxygen and cooling gradually until the temperature of said substrate is towered to 350° C. or less after the growth of said ZnO based oxide semiconductor layer is completed.

2. The method of claim 1, wherein a speed at which said substrate is gradually cooled is 5 to 10° C./minute.

3. A method of manufacturing a semiconductor light emitting device in which a light emitting layer forming portion having an active layer comprising $Cd_xZn_{1-x}O$ ($0 \leq x \leq 1$) sandwiched by cladding layers comprising $Mg_yZn_{1-y}O$ ($0 \leq y < 1$) is grown on a substrate having a different coefficient of thermal expansion from that of a ZnO bases oxide semiconductor, comprising the steps of:

growing a buffer layer made of a ZnO based oxide a surface of said substrate at a lower temperature than a high temperature of 500° C. or more, on which said light emitting layer forming portion is to be grown, and stopping at least the supply of an oxygen and raising the temperature of said substrate to said high temperature;

growing semiconductor layers including said light emitting layer farming portion at high temperature of 500° C. or more, and cooling gradually said substrate down to 350° C. or less while stopping the supply of an oxygen, after the growth of a ZnO based oxide semiconductor layer is completed at the high temperature.

4. The method of claim 3, wherein said light emitting layer forming portion is grown to constitute a light emitting diode or a laser diode.

5. The method of claim 3, wherein a speed at which said substrate is gradually cooled is 5 to 10° C./minute.

* * * * *